United States Patent
Shue et al.

(10) Patent No.: US 6,815,336 B1
(45) Date of Patent: Nov. 9, 2004

(54) PLANARIZATION OF COPPER DAMASCENE USING REVERSE CURRENT ELECTROPLATING AND CHEMICAL MECHANICAL POLISHING

(75) Inventors: Shau-Lin Shue, Hsinchu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 09/160,965

(22) Filed: Sep. 25, 1998

(51) Int. Cl.$^7$ .................. H01L 21/4763; H01L 21/44; H01L 21/311

(52) U.S. Cl. ............... 438/626; 438/631; 438/633; 438/645; 438/687; 438/697

(58) Field of Search ................ 438/687, 631, 438/633, 645, 626, 697, 699

(56) References Cited

U.S. PATENT DOCUMENTS

| | | | |
|---|---|---|---|
| 4,702,792 A | 10/1987 | Chow et al. | 156/628 |
| 4,789,648 A | 12/1988 | Chow et al. | 437/225 |
| 4,954,459 A | 9/1990 | Avanzino et al. | 437/228 |
| 5,256,565 A | * 10/1993 | Bernhardt et al. | 438/628 |
| 5,346,584 A | 9/1994 | Nasr et al. | 156/636 |
| 5,494,857 A | 2/1996 | Cooperman et al. | 437/228 |
| 5,567,300 A | * 10/1996 | Datta et al. | 205/652 |
| 5,578,523 A | * 11/1996 | Fiordalice et al. | 438/633 |
| 5,602,423 A | 2/1997 | Jain | 257/752 |
| 5,693,563 A | 12/1997 | Teong | 437/190 |
| 5,969,422 A | * 10/1999 | Ting et al. | 257/762 |
| 6,008,116 A | * 12/1999 | Tran | 438/623 |
| 6,069,068 A | * 5/2000 | Rathore et al. | 438/628 |
| 6,093,656 A | * 7/2000 | Lin | 438/734 |

OTHER PUBLICATIONS

C.Y. Chang et al, "ULSI Technology" The McGraw–Hill Companies, Inc, New York, 1996, p 447.

* cited by examiner

*Primary Examiner*—Erik Kielin
(74) *Attorney, Agent, or Firm*—Haynes and Boone, LLP

(57) ABSTRACT

Methods are disclosed to improve the planarization of copper damascene by the steps of patterning on the copper damascene a photoresist using a reverse tone photo mask or a reverse tone photo mask of the metal lines, removing excess copper by reverse current plating or by dry or wet chemical etching, stripping the photo resist, and a subsequent chemical mechanical planarization of the copper damascene. Lastly a cap layer is applied to the planarized surface. In a variant of the disclosed method a more relaxed reverse tone photo mask of the metal lines is used, which may be more desirable for practical use. These steps provide benefits such as improved uniformity of the wafer surface, reduce the dishing of metal lines (trenches) and pads, and reduce oxide erosion.

6 Claims, 7 Drawing Sheets

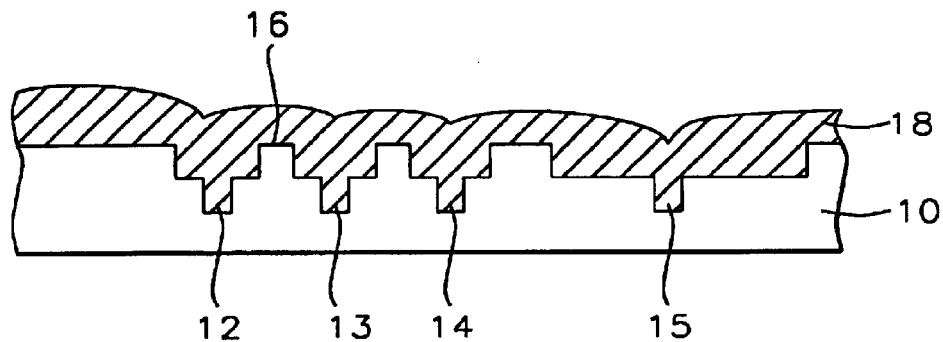
FIG. 1a – Prior Art
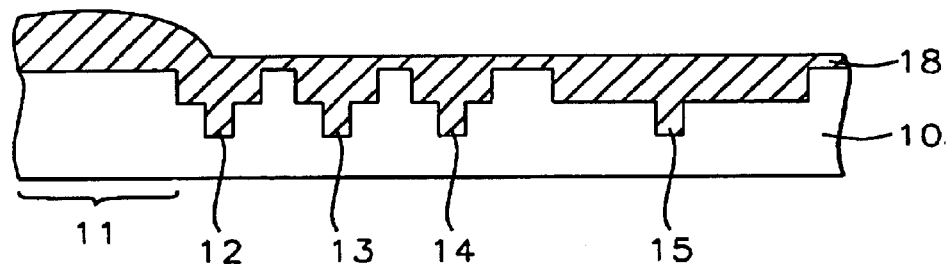
FIG. 1b – Prior Art
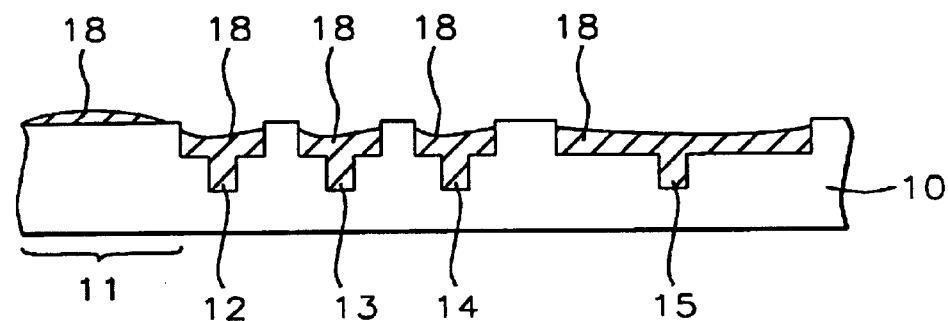
FIG. 1c – Prior Art

PLANARIZATION OF COPPER DAMASCENE USING REVERSE CURRENT ELECTROPLATING AND CHEMICAL MECHANICAL POLISHING

BACKGROUND OF THE INVENTION

1. Field of the Invention

The invention relates to methods of fabricating copper damascene wiring on a semiconductor wafer, and more particularly to methods of planarizing, without dishing, damascene copper and similar metals.

2. Description of the Related Art

Copper damascene wiring is one of the most promising technologies to reduce the RC delay as well as to perform the shrinkage of interconnect structures. Metal filling not only submicron trenches but submicron holes is the key for damascene wiring. To realize the Cu-damascene wiring, new technologies with excellent step coverage such as metal-organic chemical vapor deposition (MOCVD) and electro-plating deposition have been studied. After Cu deposition, the task of the polishing process is to remove only the top of the surfaces and not to encroach on the trench of a patterned sample.

There are several problems which have to be solved before the method of damascening can be widely used. FIGS. 1a–c illustrate typical problems for planarizing damascene using chemical mechanical planarization (CMP) techniques: there is 1) metal remaining on the larger open area(s) and 2) dishing in the wide field regions of the patterns.

Prior art FIG. 1a shows a cross-section of dual damascene trenches 12, 13, 14, and 15 formed in a silicon oxide ($SiO_2$) 10 on a silicon semiconductor substrate. A conformal barrier metal layer 16 is deposited on-top of the thus patterned silicon oxide. Layer 16 stops contamination of the $SiO_2$ by copper 18, or other metal, which is next deposited over the barrier metal layer, filling the trenches. It can be seen that the surface of the copper damascene is quite uneven as the copper fills the trenches. FIG. 1b shows the silhouette of the copper during CMP. In area 11 (plateau) without trenches the copper is higher than in areas with trenches. The result of further planarization is shown in FIG. 1c. On the plateau there is still copper residue, while the planarization has resulted in dishing of the copper in the trenches. In fact the surface has not been "planarized" as intended.

U.S. Pat. No. 5,602,423 (Jain) shows a damascene process using CMP and electroplating which uses an embedded pillar to prevent damage (e.g. dishing, smearing, overetching). However, this reference differs from the proposed invention.

U.S. Pat. No. 5,567,300 (Datta et al.) describes a high speed electrochemical metal removal technique for planarization of multilayer copper interconnections in thin film modules.

U.S. Pat. No. 5,494,857 (Cooperman et al.) presents a shallow trench isolation planarization method using an etch back process with a reverse tone filler mask and an oxide block in the depressions above the trenches and CMP process.

U.S. Pat. No. 5,346,584 (Nasr et al.) discloses a shallow trench isolation planarization method using an etch back process with a reverse tone filler mask and an oxide filler in the depressions above the trenches and CMP process.

Other patents bear on the forming of copper damascene but do not appear to bear directly on the proposed invention.

U.S. Pat. No. 5,693,563 (Teong) shows a method of forming an etch stop for a copper damascene process with CMP.

U.S. Pat. No. 4,954,459 (Avanzino et al.) shows a planarization technique using a reverse mask and etch back only technique.

U.S. Pat. No. 4,789,648 (Chow et al.) shows a method for forming metal interconnects that uses CMP of metal (W or Al alloys).

U.S. Pat. No. 4,702,792 (Chow et al.) discloses a method for producing coplanar multi-level metal/insulator films on a substrate and for forming patterned conductive lines simultaneously with stud vias.

C. Y. Chang, S. M. Sze, in *ULSI Technology*, by The McGraw-Hill Company, Inc. copyright 1997, pp. 444–445 discusses damascene and dual damascene techniques.

SUMMARY OF THE INVENTION

It is an object of the present invention to provide a method to reduce the CMP generated non-uniformity of the wafer surface, the dishing of the copper damascene lines and pads, and the erosion of the silicon oxide layer.

Another object of the present invention is to reduce the time for copper polishing in CMP.

A further object of the present invention is to reduce metal line erosion and to improve metal continuity.

It is yet another object of the present invention to improve the subsequent photo processing by providing a global planar surface.

These objects have been achieved by patterning on the copper damascene a photoresist using a reverse tone photo mask or a reverse tone photo mask of the metal lines, removing excess copper by reverse current plating or dry or wet chemical etching, stripping the photo resist, and planarized by chemical mechanical planarization of the copper damascene. In one embodiment a more relaxed reverse tone photo mask of the metal lines is used, which may be more desirable for practical use.

BRIEF DESCRIPTION OF THE DRAWINGS

FIGS. 1a–c, labeled "prior art" are a series of cross-sectional views showing a method of planarizing copper damascene.

DESCRIPTION OF THE PREFERRED EMBODIMENT

Figure 2A:
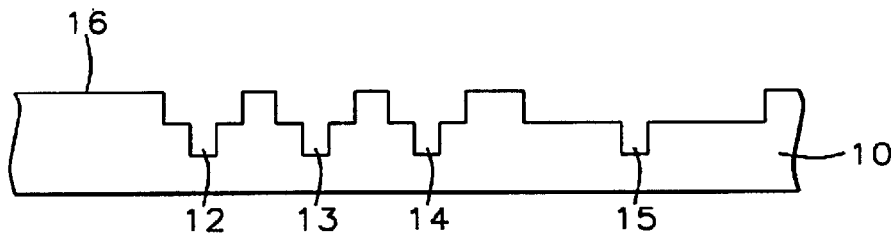
FIGS. 2a–h are a series of cross-sectional views showing one method of the invention of planarizing copper damascene.
Figure 2B:
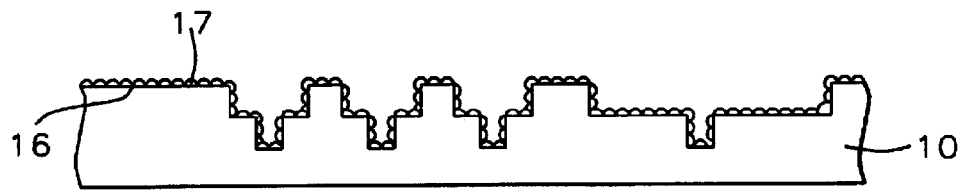
Figure 2C:
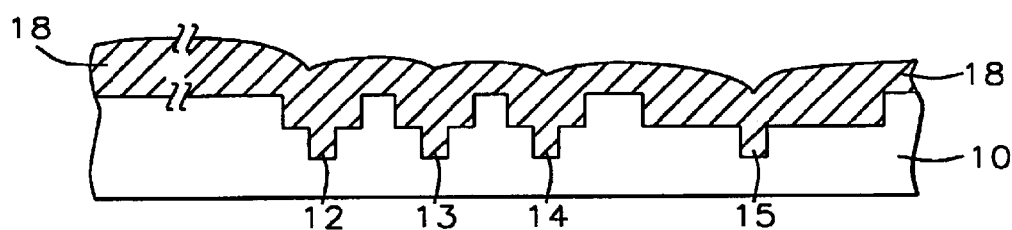
Figure 2D:
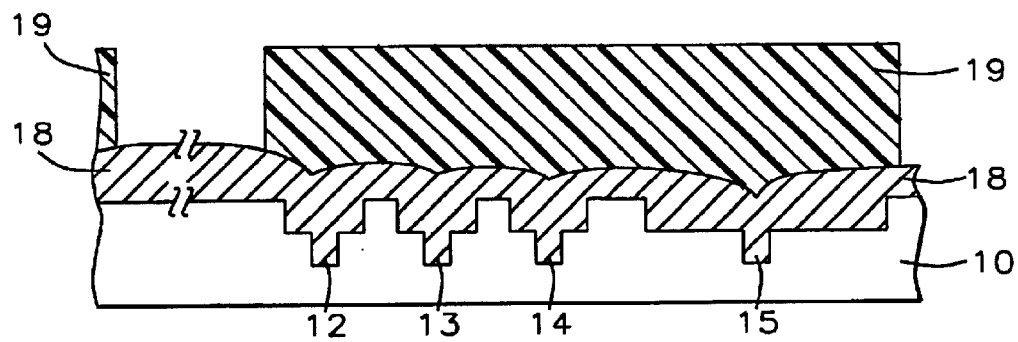

Damascene is becoming important for future interconnection of devices on silicon semiconductor substrates. One major problem associated with the formation of damascenes is chemical mechanical planarization (CMP). During CMP the complete removal of metal film on silicon oxide ($SiO_2$) is difficult. Although copper (Cu) or aluminum (Al) on silicon oxide can be cleared out by overpolishing, dishing appears. Moreover, erosion of dense metal lines may occur as well. Thus, in this invention, a reverse tone photo mask is proposed which allows the removal of the redundant Cu or Al from the silicon oxide. When the Cu or Al on the silicon oxide is etched off, the margin of the CMP process becomes improved because overpolish is not critical.

Referring now to FIG. 2, a preferred method of forming and planarizing copper damascene is described. The cross-section of FIG. 2a demonstrates, by way of example, the forming of dual damascene trenches 12, 13, 14, and 15 in a silicon oxide (SiO$_2$) layer 10 on a silicon semiconductor substrate (not shown). This is followed by depositing a conformal barrier metal layer 16 on top of the thus patterned silicon oxide to avoid contamination of the SiO$_2$ layer by the migration of copper into SiO$_2$. In FIG. 2b, a seed layer 17 is deposited on top of the barrier metal layer 16. The seed layer is a nucleation layer, comprised of metals such as chromium, titanium, copper, aluminum, or gold which causes metals such as copper to adhere more readily to the barrier layer. In FIG. 2c copper 18 or other such suitable metal is electroplated on top of the seed layer by means of forward current electroplating sufficient to more than fill the trenches. The seed layer is not shown in this and subsequent FIGS. because it is now considered part of the copper layer. The next step is FIG. 2d, where photoresist is applied and a reverse tone photoresist mask 19 is formed over the copper layer.

Figure 2E:
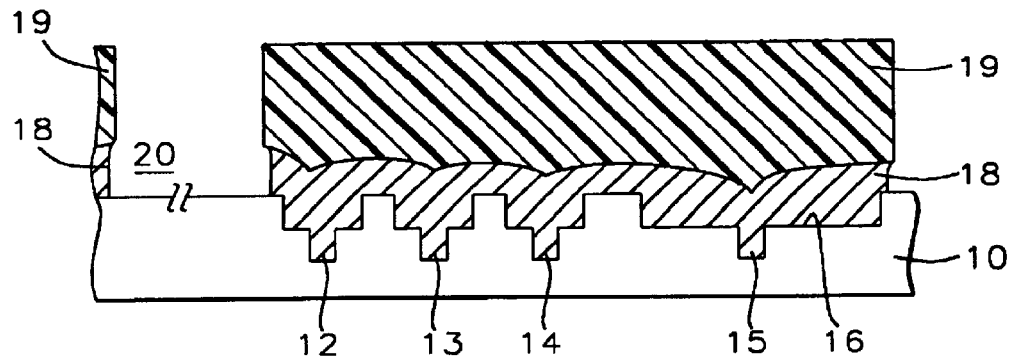

In FIG. 2e subsequent electroplating by reverse current etches away the copper layer 18 and barrier metal layer 16 from areas like area 20 not covered by photoresist. The areas not covered by photoresist are larger areas of the silicon wafer devoid of metal lines (trenches). Since the etching is isotropic it must be assured that there is a sufficient margin of copper 18 between area 20 and the adjacent trench, here trench 12.

Electroplating of copper or other metals occurs by connecting a first and second metal electrode to the minus and plus side of a voltage source such a battery, respectively. The electrode connected to the minus side is called the cathode and the electrode connected to the plus side is called the anode. Placing both electrodes into a cell with an electrolyte causes electric current to flow from the anode to the cathode. The amount of current flowing is given by Ohm's law:

I=E/R where I is the current in amperes, E is the electric potential between the two electrodes in volts, and R is the resistance of the electrolyte in ohms.

When the anode is copper, copper ions flow from the anode to the cathode and are deposited there according to the equation:

$Cu^{2+} + 2e \rightarrow Cu$

This is the plating process.

If a wafer is attached to the cathode, copper will be deposited on the wafer as a function of the current flowing. When the polarity of the voltage source is reversed then copper will be removed from the wafer and will be redeposited on the copper electrode according to the equation:

$Cu \rightarrow Cu^{2+} + 2e$

This is the plating process by reverse current or etching. The following is one example of power supply setpoints for electroplating (deposition) of copper which were used:

| | |
|---|---|
| forward current | 9.0 Amp for 200 mm wafers |
| | 5.1 Amp for 150 mm wafers |
| forward on | 95 ms |
| forward off | 5 ms |

The following is one example of power supply setpoints for electroplating (removal) of copper which were used:

| | |
|---|---|
| reverse current | 4.8 Amp for 200 mm wafers |
| | 2.7 Amp for 150 mm wafers |
| reverse on | 25 ms |
| reverse off | 5 ms | peak cathodic current density is: 29 mA/cm$^2$

Figure 2F:
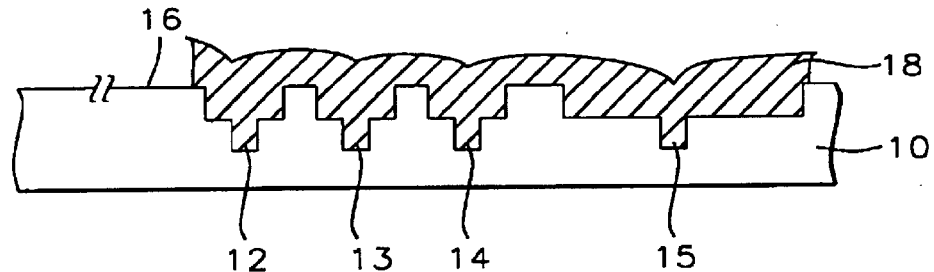
Figure 2G:
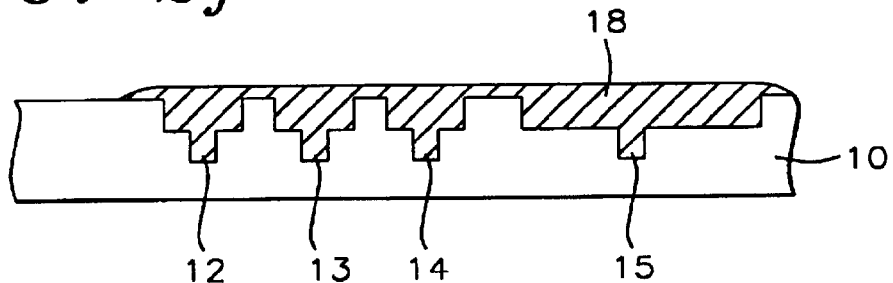
Figure 2H:
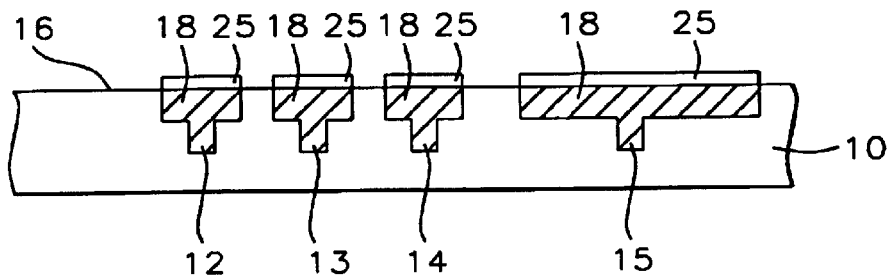

In the next step, FIG. 2f, the photoresist is stripped away, exposing the electroplated copper 18. The copper dual damascene 18 and barrier metal layer 16 are next planarized by CMP. FIG. 2g shows the copper partially removed by CMP and FIG. 2h shows the copper dual damascene 18 and metal barrier layer 16 after completion of CMP where the copper dual damascene 18 is completely coplanar with the upper surface and without any dishing in the trenches 12, 13, 14, and 15. In a last step the copper dual damascene is sealed with a cap layer 25, such as nitride or oxynitride. The copper layer 18 can be replaced by a layer of metal from the group comprising gold, aluminum, tungsten, titanium, or silver.

Next is described another preferred method of forming and planarizing copper damascene. The cross-section of FIG. 3a demonstrates, by way of example, the forming of damascene trenches 32, 33, 34, and 35 in a silicon oxide (SiO$_2$) layer 10 on a silicon semiconductor substrate (not shown). This is followed by depositing a conformal barrier metal layer 16 on top of the thus patterned silicon oxide layer 10 to avoid contamination of the SiO$_2$ layer by the migration of copper into SiO$_2$. In FIG. 3b a copper layer 18 or other such suitable metal is deposited on top of the barrier metal layer 16 by means such as plating or chemical vapor deposition (CVD), filling the damascene trenches.

Figure 3A:
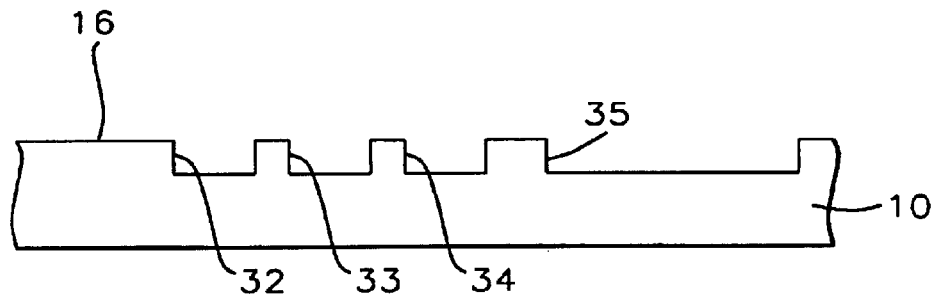
FIGS. 3a–g are a series of cross-sectional views showing another method of the invention of planarizing copper damascene.
Figure 3B:
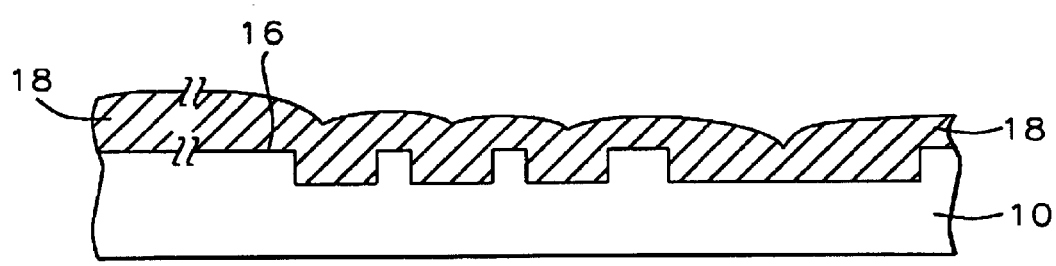
Figure 3C:
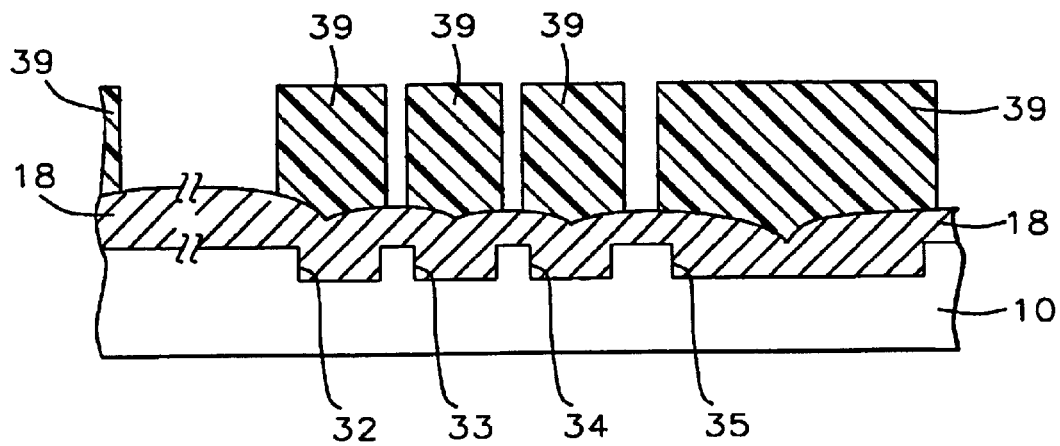
Figure 3D:
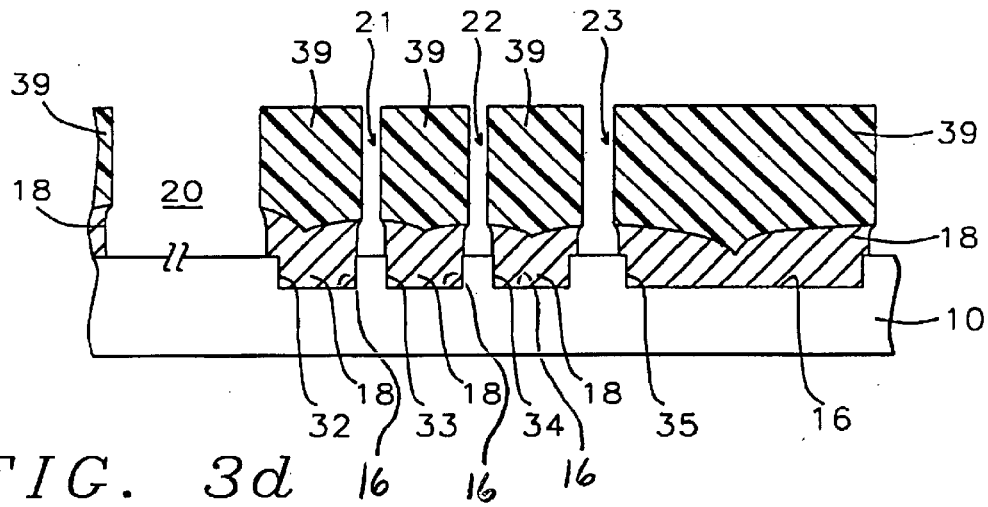
Figure 3E:
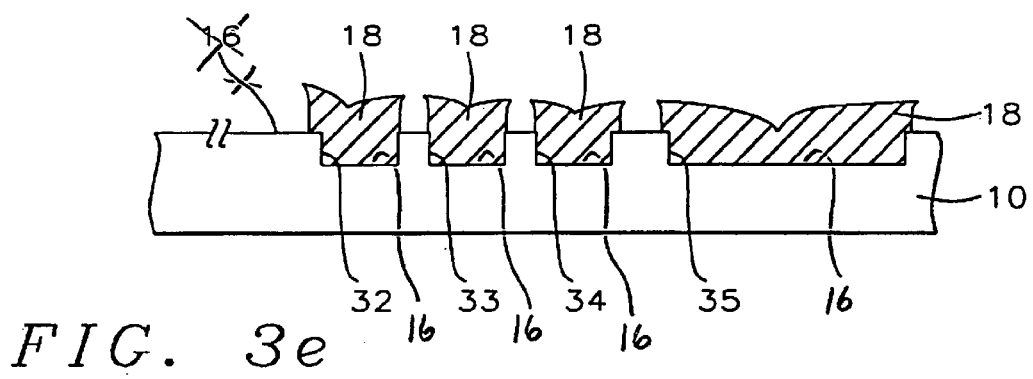
Figure 3F:
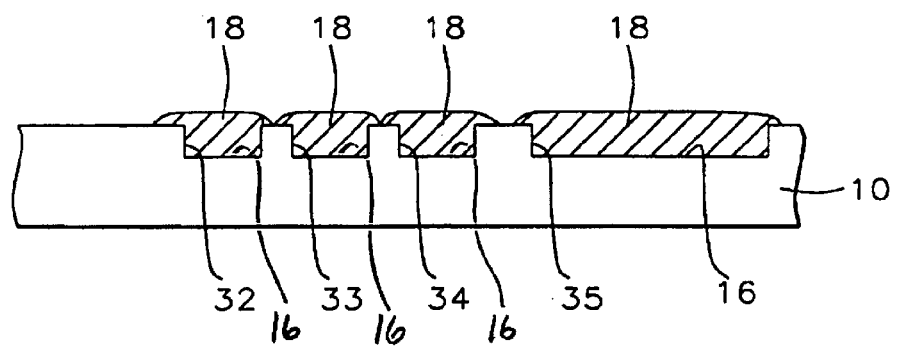
Figure 3G:
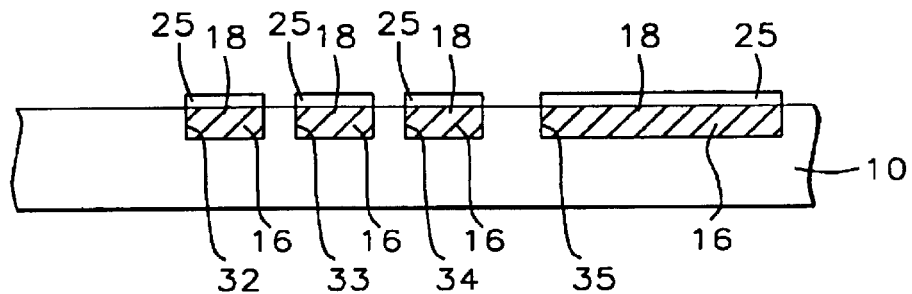

Now referring to FIG. 3c, the photoresist is applied and a reverse tone photoresist mask 39 is formed. Note that the same numbers in FIG. 2 and FIG. 3 identify the same component. As shown in FIG. 3c, there is no photoresist between trenches 32, 33, 34, and 35, because the reverse tone photo mask of the metal lines is used which by definition covers only those parts of the copper layer that are in the trenches. Next, see FIG. 3d, follows etching the copper layer 18 and barrier metal layer 16 from areas not covered by the reverse tone photoresist mask. Etching can be achieved using a dry anisotropic etch typically with chlorine (Cl2) as the etchant or using a wet isotropic etch typically with nitric acid (HNO3) as an etchant. Note that copper has been etched away from areas 20, 21, 22, and 23. In FIG. 3e the photoresist has been stripped exposing the deposited copper 18 underneath. The copper damascene 18 and barrier metal layer 16 are next planarized by CMP. FIG. 3f shows the copper partially removed during CMP and FIG. 3g shows the copper damascene 18 and metal barrier layer 16 after completion of CMP where the copper damascene 18 is completely coplanar with the upper surface and without any dishing in trenches 32, 33, 34, and 35. A last step is the sealing of the copper damascene with a cap layer 25, such as nitride or oxynitride. The copper layer 18 can be replaced by a layer of metal from the group comprising gold, aluminum, tungsten, titanium, or silver.

Another preferred method, and a modification to the method illustrated in FIGS. 3a–g, is shown in FIGS. 4a–d. The steps represented by FIGS. 3a and 3b are the same for this method and precede the steps represented by FIGS.

Figure 4A:
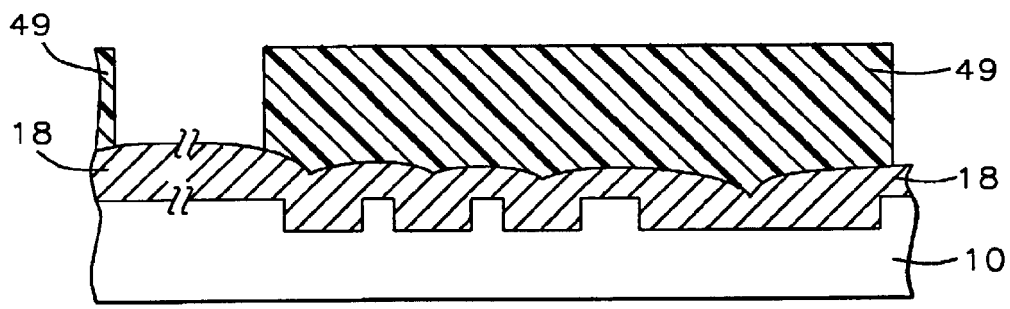
FIGS. 4a–d are a series of cross-sectional views showing a variation of the method depicted in FIGS. 3a–g.
Figure 4B:
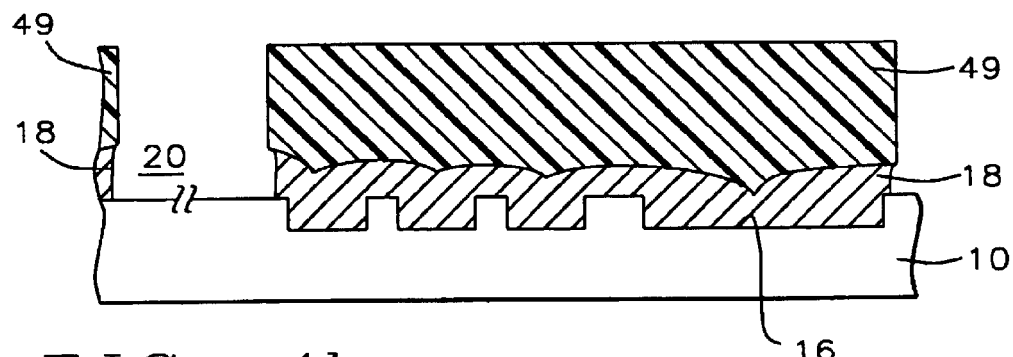
Figure 4C:
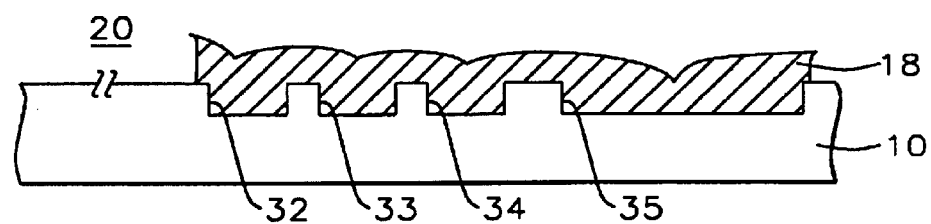
Figure 4D:
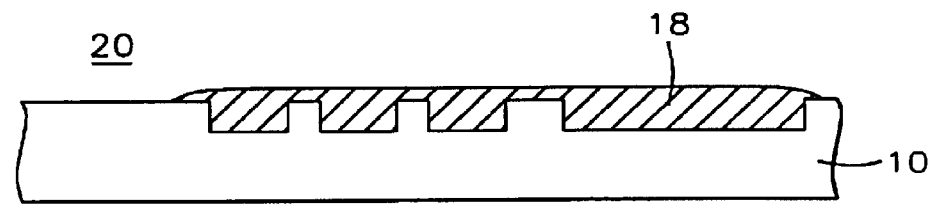

4a–d. It may be more practical, simpler and cheaper to provide a relaxed tone photoresist mask of metal lines. "Relaxed" is here defined as a photoresist mask where spaces between the trenches 21, 22, and 23 of FIG. 3d are covered if the trenches are separated by less than a critical distance. The critical distance ranges from 0.05 µm to 0.2 µm. In those areas containing trenches and pads the copper layer 18, therefore, would not be etched away. FIG. 4a shows a relaxed tone photoresist mask 49 as compared to the "not relaxed" tone photoresist mask 39 of FIG. 3c. Next, see FIG. 4b, follows etching of the copper layer 18 and barrier metal layer 16 from area 20 not covered by photoresist 49. In FIG. 4c photoresist has been stripped away by chemical means, exposing copper layer 18. Note that the copper is one continuous layer from trench 32 to 35. FIG. 4d shows the copper partially removed during CMP. Since there is little copper on area 20, there is no problem with copper residue being left on area 20 nor silicon oxide 10 erosion after this step. After completion of CMP the top surface is planar as in FIG. 3g.

Advantages of these disclosed methods are:

Reduced time for copper polishing operation (CMP),

Reduction of non-uniformity of the wafer surface,

Reduced dishing for wide metal lines and pads,

Reduced oxide erosion after damascene CMP process,

Reduced metal line erosion and improved metal continuity,

Relieve CMP pattern density sensitivity,

Improved reliability and subsequent photo processing.

While the invention has been particularly shown and described with reference to the preferred embodiments thereof, it will be understood by those skilled in the art that various changes in form and details may be made without departing from the spirit and scope of the invention.

What is claimed is:

1. A method of forming and planarizing copper layer, comprising the steps of:

providing a substrate;

forming dual damascene trenches in said substrate;

depositing a barrier metal layer on said substrate and in said dual damascene trenches;

depositing a seed layer on top of said barrier metal layer;

electroplating a copper layer on top of said seed layer by means of forward current electroplating;

forming a reverse tone photoresist mask;

etching away that part of said copper layer and said barrier metal layer not covered by said reverse tone photoresist mask by means of reverse current electroplating;

stripping of said photoresist;

planarizing by chemical mechanical polishing (CMP) said now exposed copper layer and barrier metal layer; and sealing said copper layer with a cap layer.

2. The method of claim 1, wherein said dual damascene trenches are patterned into a silicon oxide layer of a silicon semiconductor wafer.

3. The method of claim 1, wherein said substrate is a silicon oxide layer of a silicon semiconductor wafer.

4. The method of claim 1, wherein said reverse tone photoresist mask is a photoresist mask covering that part of said copper layer which is in said trenches.

5. The method of claim 1, wherein said reverse tone photoresist mask also covers spaces between said damascene trenches having a separation of less than a critical distance.

6. The method of claim 5, wherein said critical distance ranges from 0.05 µm to 0.2 µm.

* * * * *